United States Patent
Lee et al.

(10) Patent No.: US 9,906,864 B2
(45) Date of Patent: Feb. 27, 2018

(54) METHOD, USER TERMINAL, AND AUDIO SYSTEM, FOR SPEAKER LOCATION DETECTION AND LEVEL CONTROL USING MAGNETIC FIELD

(71) Applicant: SAMSUNG ELECTRONICS CO., LTD., Suwon-si (KR)

(72) Inventors: Byeong-hu Lee, Suwon-si (KR); Yong-hee Park, Suwon-si (KR); Hun-sok Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 211 days.

(21) Appl. No.: 14/789,154

(22) Filed: Jul. 1, 2015

(65) Prior Publication Data

US 2016/0007118 A1    Jan. 7, 2016

(30) Foreign Application Priority Data

Jul. 2, 2014  (KR) .................. 10-2014-0082289

(51) Int. Cl.
   *H04R 5/04*     (2006.01)
   *H04S 7/00*     (2006.01)
   *G01R 33/02*    (2006.01)
   *G06F 3/16*     (2006.01)

(52) U.S. Cl.
   CPC .............. *H04R 5/04* (2013.01); *G01R 33/02* (2013.01); *G06F 3/165* (2013.01); *H04S 7/301* (2013.01); *H04S 7/40* (2013.01); *H04R 2205/024* (2013.01)

(58) Field of Classification Search
   USPC .............. 381/303; 324/329; 348/51; 600/12; 455/456.6
   See application file for complete search history.

(56) References Cited

U.S. PATENT DOCUMENTS

| 7,532,901 B1* | 5/2009 | LaFranchise | H04M 1/6066 455/456.6 |
| 8,823,782 B2* | 9/2014 | Karaoguz | G06F 3/011 348/51 |
| 2007/0255087 A1* | 11/2007 | Minai | A61B 5/062 600/12 |
| 2011/0157327 A1 | 6/2011 | Seshadri et al. | |
| 2015/0204995 A1* | 7/2015 | Olsson | G01V 3/15 324/329 |

FOREIGN PATENT DOCUMENTS

JP    2006129147 A    5/2006

OTHER PUBLICATIONS

Communication dated Dec. 7, 2015, issued by the European Patent Office in counterpart European Application No. 15174435.6.

* cited by examiner

*Primary Examiner* — MD S Elahee
(74) *Attorney, Agent, or Firm* — Sughrue Mion, PLLC

(57) ABSTRACT

Provided is a control method of a user terminal apparatus and device, for speaker location detection and level control using a magnetic field. The method includes receiving reference magnetic field information generated by at least one speaker, in response to a magnetic field being generated based on the reference magnetic field information by the at least one speaker, detecting the magnetic field generated by the at least one speaker, acquiring location information of the at least one speaker using the detected magnetic field information and the reference magnetic field information, and transmitting the location information of each of the at least one speaker to a source apparatus.

22 Claims, 15 Drawing Sheets

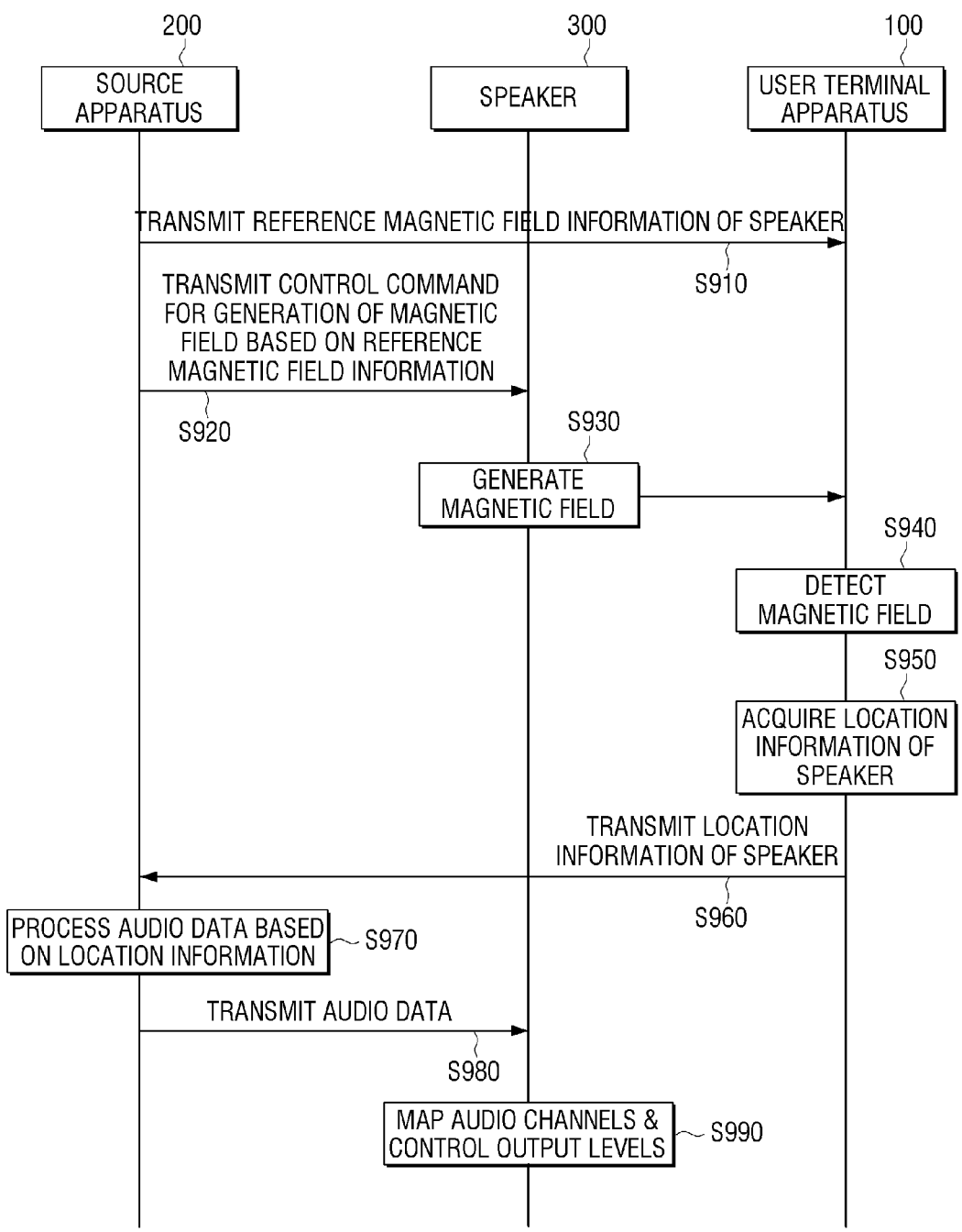

METHOD, USER TERMINAL, AND AUDIO SYSTEM, FOR SPEAKER LOCATION DETECTION AND LEVEL CONTROL USING MAGNETIC FIELD

CROSS-REFERENCE TO RELATED APPLICATION

This application claims priority from Korean Patent Application No. 10-2014-0082289, filed on Jul. 2, 2014, in the Korean Intellectual Property Office (KIPO), the disclosure of which is incorporated herein by reference in its entirety.

BACKGROUND

Field

Apparatuses and methods consistent with exemplary embodiments relate to a user terminal and an audio system for speaker location detection and level control using a magnetic field, and a method of controlling the same. Exemplary embodiments further relate to a user terminal and an audio system for mapping audio channels of speakers and controlling output levels by a source apparatus by detecting a magnetic field of each speaker, generated based on reference magnetic field information, and transmitting location information of each speaker to the source apparatus using the detected magnetic field information and the reference magnetic field information, and a method of controlling the same.

Description of the Related Art

Recently, various types of electronic apparatuses have been developed and commercialized. These apparatuses include a plurality of speakers, such as a home theater system, a room speaker, and a display apparatus as used in a home.

Users with insufficient expertise have difficulty and inconvenience in trying to optimize the output of sound based on consideration of a correlation between a direction of a speaker relative to a user and a distance from the user to install a plurality of speakers, such as a home theater system, or a room speaker.

Although various technologies for automatically mapping a channel or setting a level according to a direction and distance of a speaker have been developed, these methods have a limit in that the cost in terms of hardware for production of products is increased and usability of a user based on the costs is not good.

SUMMARY

Aspects of one or more exemplary embodiments may overcome the above disadvantages and other disadvantages not described above. Also, the exemplary embodiments are not required to overcome the disadvantages described above, and an exemplary embodiment may not overcome any of the problems described above.

Aspects of one or more exemplary embodiments provide a method of controlling a user terminal apparatus.

According to an aspect of an exemplary embodiment, there is provided a method including: receiving reference magnetic field information generated by at least one speaker; detecting a magnetic field generated by the at least one speaker, the magnetic field being generated based on the reference magnetic field information of the at least one speaker; and acquiring location information of each of the at least one speaker using information of the detected magnetic field and the reference magnetic field information.

The method may further include wherein the acquiring location information comprises detecting a direction of a magnetic field with a largest scale, to acquire direction information of the speaker using a three-axis magnetic field detection sensor, and finding distance information of the speaker, using the detected magnetic field information and the reference magnetic field information.

The method may further include transmitting the location information of each of the at least one speaker to a source apparatus, wherein the receiving comprises receiving the reference magnetic field information generated by the at least one speaker from the source apparatus, in response to the user terminal apparatus being connected to the source apparatus for controlling the at least one speaker.

The method may further include transmitting the location information of each of the at least one speaker to a source apparatus, wherein the receiving comprises receiving the reference magnetic field information generated by the at least one speaker from the at least one speaker in response to the user terminal apparatus being connected directly to the at least one speaker.

The method may further include wherein the source apparatus maps audio channels of the at least one speaker based on the location information of each of the at least one speaker and controls output levels of the at least one speaker in response to the location information of each of the at least one speaker being received from the user terminal apparatus.

The method may further include wherein: the source apparatus displays a user interface (UI) for setting location information of a speaker, and in response to the location information of each of the at least one speaker being received from the user terminal apparatus, the source apparatus displays a message indicating that at least one received location information is acquired, in the UI.

The method may further include wherein the reference magnetic field information comprises correlation between a magnetic field scale and a distance from the speaker.

The method may further include wherein the reference magnetic field information comprises a mathematical function correlating a magnetic field scale and a distance from the speaker.

According to an aspect of another exemplary embodiment, there is provided a user terminal apparatus comprising: a communicator configured to communicate with an external device; a magnetic field detector configured to detect a magnetic field generated by a speaker; and a controller configured to acquire reference magnetic field information generated by at least one speaker through the communicator and to acquire location information of each of the at least one speaker using the magnetic field information detected through the magnetic field detector and the reference magnetic field information.

The user terminal apparatus may further include wherein the controller is further configured to detect a direction of a magnetic field with a largest scale to acquire direction information of a speaker using the magnetic field detector comprising a three-axis magnetic field detection sensor and acquires distance information of the speaker using the detected magnetic field information and the reference magnetic field information.

The user terminal apparatus may further include wherein the controller is further configured to control the communicator to transmit the location information of each of the at least one speaker to a source apparatus and to control the communicator to receive the reference magnetic field information generated by the at least one speaker from the at least one speaker in response to the user terminal apparatus being connected directly to the at least one speaker through the communicator.

The user terminal apparatus may further include wherein: the controller is further configured to control the communicator to transmit the location information of each of the at least one speaker to a source apparatus, and the source apparatus maps audio channels of the at least one speaker based on the location information of each of the at least one speaker and controls output levels of the at least one speaker in response to the location information of each of the at least one speaker being received from the user terminal apparatus.

The user terminal apparatus may further include wherein a source apparatus displays a user interface (UI) for setting location information of a speaker, and in response to the location information of each of the at least one speaker being received from the user terminal apparatus, the source apparatus displays a message indicating that at least one received location information is acquired, in the UI.

According to an aspect of another exemplary embodiment, there is provided an audio system for use with a user terminal apparatus, the audio system including: at least one speaker; and a source apparatus configured to transmit reference magnetic field information generated by the at least one speaker to the user terminal apparatus, in response to the user terminal apparatus being connected to the source apparatus for controlling the at least one speaker, wherein the source apparatus is configured to transmit a control command for generation of a magnetic field based on the reference magnetic field information to the at least one speaker, wherein the at least one speaker is configured to generate a magnetic field based on reference magnetic field information in response to the control command, and wherein the user terminal apparatus is configured to detect the magnetic field generated by the at least one speaker, acquire location information of each of the at least one speaker using the detected magnetic field information and the reference magnetic field information, transmit the location information of each of the at least one speaker to the source apparatus, and process audio data based on the location information of each of the at least one speaker and transmitting the audio data to the at least one speaker.

The audio system may further include wherein the source apparatus maps audio channels of the at least one speaker based on the location information of each of the at least one speaker and controls output levels of the at least one speaker in response to the location information of each of the at least one speaker being received from the user terminal apparatus.

The audio system may further include wherein: the source apparatus displays a user interface (UI) for setting location information of a speaker, and in response to the location information of each of the at least one speaker being received from the user terminal apparatus, the source apparatus displays a message indicating that at least one received location information is acquired, in the UI.

According to an aspect of another exemplary embodiment, there is provided a method of locating a speaker in an audio system, the method including: receiving reference magnetic field information of the speaker, the reference magnetic field information comprising correlation between a magnetic field scale and a distance from the speaker; detecting a magnetic field generated by the speaker; and acquiring location information of the speaker by using information of the detected magnetic field and the reference magnetic field information.

The method may further include transmitting the location information of the speaker to a source apparatus.

The method may further include wherein the reference magnetic field information is sent to a device from the speaker.

The method may further include wherein the reference magnetic field information is sent to a device from the source apparatus.

The method may further include wherein the location information comprises a direction of the generated magnetic field and a distance from the speaker.

Additional and/or other aspects and advantages of the disclosure will be set forth in part in the description which follows and, in part, will be obvious from the description, or may be learned by practice of the disclosure.

BRIEF DESCRIPTION OF THE DRAWING FIGURES

The above and/or other aspects will be more apparent by describing certain exemplary embodiments with reference to the accompanying drawings, in which:

FIG. 9 is a sequence diagram for explanation of a control operation of an audio system according to an exemplary embodiment;

DETAILED DESCRIPTION OF THE EXEMPLARY EMBODIMENTS

Figure 1:
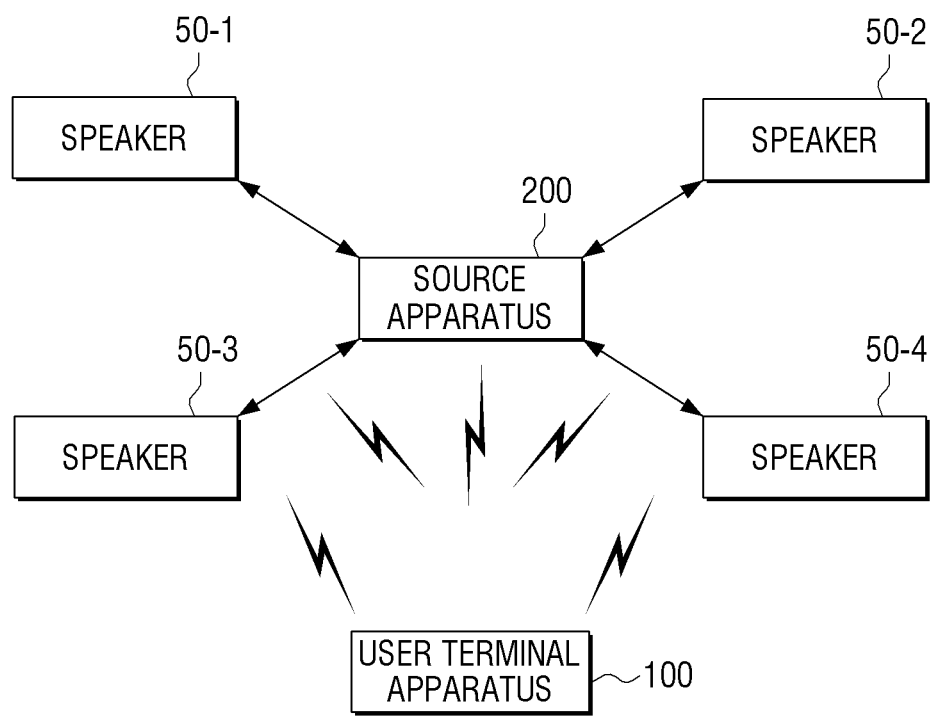
FIG. 1 is a diagram illustrating an audio system according to an exemplary embodiment.

Reference will now be made in detail to exemplary embodiments, examples of which are illustrated in the accompanying drawings. In this regard, the present exemplary embodiments may have different forms and should not be construed as being limited to the descriptions set forth herein. In the following description, well-known functions or constructions are not described in detail so as not to obscure the embodiments with unnecessary detail. FIG. 1 is a diagram illustrating an audio system according to an exemplary embodiment. Referring to FIG. 1, the audio system includes a user terminal apparatus 100, a plurality of speakers 50-1, 50-2, 50-3, and 50-4, and a source apparatus 200.

The user terminal apparatus 100 may be capable of being freely moved within a service area formed by a base station to communicate with the base station and may be one of various types of apparatuses that are portable by a user, such as a cellular phone, a personal communication service (PCS) phone, or a navigation device. In exemplary embodiments, the user terminal apparatus 100 may be embodied as a mobile communication terminal such as a personal digital assistant (PDA), a hand-held personal computer (PC), a global system for mobile (GSM) phone, a wideband-CDMA phone, a CDMA-2000 phone, a mobile broadband system (MBS) phone, or the like.

When the user terminal apparatus 100 is connected to the source apparatus 200 for controlling the at least one speaker 50-1 to 50-4, the user terminal apparatus 100 may receive reference magnetic field information of the at least one speaker 50-1 to 50-4 from the source apparatus 200. Then, in response to a control command, for generating a magnetic field based on the reference magnetic field information, being transmitted to the at least one speaker 50-1 to 50-4 by the source apparatus 200, the at least one speaker 50-1 to 50-4 may generate the magnetic field in response to the control command.

In this case, the user terminal apparatus 100 may acquire location information of each of the at least one speaker 50-1 to 50-4 by using the magnetic field generated by the each speaker 50-1 to 50-4 and the reference magnetic field information. Then, in response to the acquired location information being transmitted to the source apparatus 200 through a communicator by the user terminal apparatus 100, the source apparatus 200 may process audio data based on the received location information and transmit the audio data to the at least one speaker 50-1 to 50-4.

The source apparatus 200 may provide content including image data and voice data. An exemplary embodiment of the source apparatus 200 may be a display apparatus but the technical idea of the exemplary embodiments may be applied to a similar apparatus, such as a monitor, a projection television (TV), or a notebook computer.

As described above, the source apparatus 200 may transmit the reference magnetic field information of at least one speaker 50-1 to 50-4 to the user terminal apparatus 100, receive the location information of the at least one speaker 50-1 to 50-4 from the user terminal apparatus 100, process audio data, and then transmit the audio data to the at least one speaker 50-1 to 50-4.

In detail, in response to receiving location information of each of the at least one speaker 50-1 to 50-4 from the user terminal apparatus 100, the source apparatus 200 may map audio channels of at least one speaker based on the location information of the at least one speaker 50-1 to 50-4 and control output levels.

In this case, when the source apparatus 200 includes a display unit, the source apparatus 200 may display a user interface (UI) for setting the location information of the speakers 50-1 to 50-4. In response to the location information of the at least one speaker 50-1 to 50-4 being received from the user terminal apparatus 100, the source apparatus 200 may display a message indicating that at least one received location information item is acquired.

According to the present embodiment, the plurality of speakers 50-1 to 50-4 may provide components of an audio signal of 5.1 channels to a user. A sound method of 5.1 channels may use, as basic components, a main body for supporting a digital theater system (DTS) and a Dolby system, and 5.1 channels speakers, including a front-left speaker, a front-right speaker, a center speaker, a surround-left speaker, and a surround-right speaker.

According to the present exemplary embodiment, as shown in FIG. 1, the center speaker of the 5.1 channels may be embodied in the source apparatus 200.

Hereinafter, the aforementioned speakers will be referred to as the terms of a front-left (FL) speaker, a front-right (FR) speaker, a center (C) speaker, a surround-left (SL) speaker, and a surround-right (SR) speaker, respectively.

Hereinafter, the user terminal apparatus 100 according various embodiments of a present exemplary embodiment will be described with reference to FIGS. 2A to 4D.

Figure 2A:
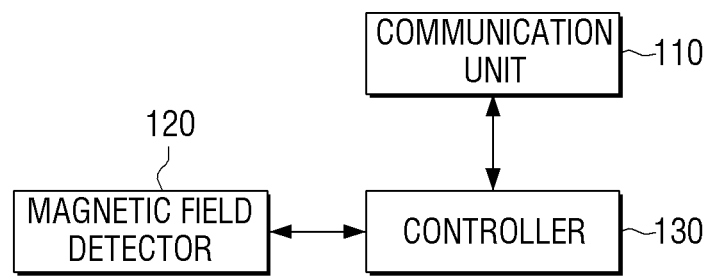
FIG. 2A is a block diagram illustrating a configuration of a user terminal apparatus according to an exemplary embodiment.

FIG. 2A is a block diagram illustrating a configuration of the user terminal apparatus 100 according to an exemplary embodiment.

As illustrated in FIG. 2A, the user terminal apparatus 100 includes the communicator 110, a magnetic field detector 120, and a controller 130.

FIG. 2A illustrates components of the exemplary embodiment in which the user terminal apparatus 100 has a function for detecting a magnetic field of a surrounding electronic device. Accordingly, in some exemplary embodiments, some of the components shown in FIG. 2A may be omitted or changed and other components may be added.

The communicator 110 is a component for communicating with various types of external devices according to various types of communication methods. In particular, the communicator 110 may receive the reference magnetic field information from the source apparatus 200. In this case, the communicator 110 may transmit the location information to the source apparatus 200 using the magnetic field detected from the at least one speaker 50-1 to 50-4 and the reference magnetic field information.

The magnetic field detector 120 is a sensor for detection of a magnetic field. According to an exemplary embodiment, the magnetic field detector 120 may detect the magnetic field generated by the at least one speaker 50-1 to 50-4. In detail, the magnetic field detector 120 may detect a direction of a magnetic field with a largest scale using a three-axis magnetic field sensor included in the magnetic field detector 120.

The controller 130 may control the user terminal apparatus 100, the source apparatus 200 that interfaces with the user terminal apparatus 100, and the at least one speaker 50-1 to 50-4.

In particular, the controller 130 may acquire the reference magnetic field information of the at least one speaker 50-1 to 50-4 from the source apparatus 200 through the communicator 110, acquire the location information of each of the at least one speaker 50-1 to 50-4 using the magnetic field detected by the magnetic field detector 120 and the reference magnetic field information received through the communicator 110, and control the communicator 110 to transmit the acquired location information to the source apparatus 200, which will be described below in detail.

Figure 2B:
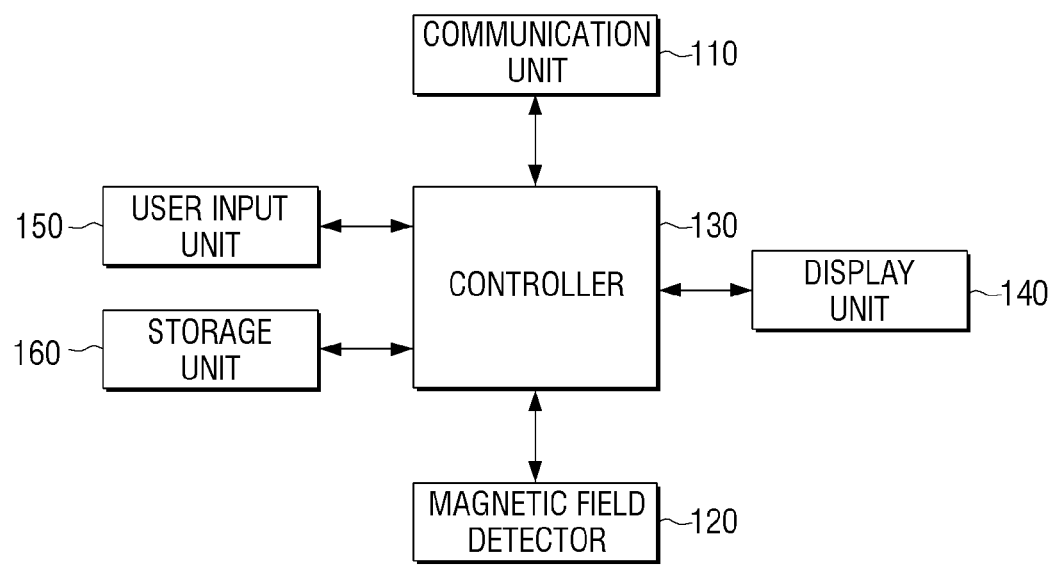
FIG. 2B is a block diagram illustrating a configuration of a user terminal apparatus in detail according to an exemplary embodiment.

FIG. 2B is a block diagram illustrating a configuration of the user terminal apparatus 100 in detail according to an exemplary embodiment.

As shown in FIG. 2B, the user terminal apparatus 100 includes the communicator 110, the magnetic field detector 120, a user input unit 150, a storage unit 160, and a display unit 140.

As described above, the communicator 110 may receive reference magnetic field information from the source apparatus 200. In this case, the communicator 110 may transmit the acquired location information to the source apparatus 200 using the magnetic field detected from the at least one speaker 50-1 to 50-4 and the reference magnetic field information.

In exemplary embodiments, the communicator 110 may communicate with the source apparatus 200 and the plurality of speakers 50-1 to 50-4 using an infrared ray communication method. However, this is merely exemplary and the communicator 110 may communicate with the source apparatus 200 and the plurality of speakers 50-1 to 50-4 through various wireless communication technologies, such as WiFi, Bluetooth, radio frequency (RF), IEEE 802.11, WLAN, HR WPAN, UWB, LR WPAN, IEEE and 1394, among others.

The magnetic field detector 120 is a sensor for detecting a magnetic field. That is, the magnetic field detector 120 refers to a sensor that detects a magnetic field formed in south and north directions of the earth and measures an azimuth. Here, the magnetic field detector 120 may be embodied as a three-axis geomagnetic sensor for measuring the intensity and direction of magnetism with respect to three orthogonal axes. According to exemplary embodiments, the magnetic field detector 120 may detect the magnetic field generated by the at least one speaker 50-1 to 50-4. In detail, the magnetic field detector 120 may detect a direction of a magnetic field with a largest scale using the three-axis magnetic sensor included in the magnetic field detector 120.

The user input unit 150 receives various user commands for controlling the source apparatus 200 and the at least one speaker 50-1 to 50-4 that are disposed outside the user input unit 150. In exemplary embodiments, the user input unit 150 comprises a button and may be embodied as a touchscreen. In response to items, such as a communication network service controllable through the user terminal apparatus 100 and sound output connection of the source apparatus 200, being displayed on the display unit 140, a user may select at least one of the items through the user input unit 150.

The storage unit 160 may store a program and data for driving the user terminal apparatus 100. According to an embodiment, the storage unit 160 may store a reference magnetic field received from the source apparatus 200, magnetic information discharged from the at least one speaker 50-1 to 50-4, and location information of the at least one speaker 50-1 to 50-4. The storage unit 160 may comprise a non-transitory computer readable medium.

The display unit 140 may display image data and various UIs in accordance with control of the controller 130. In some embodiments, when the display unit 140 is a touchscreen, the display unit 140 may receive a user command through the touchscreen. As described above, according to an embodiment, items such as a communication network service controllable through the user terminal apparatus 100 and sound output connection of the source apparatus 200 may be displayed on the display unit 140, which will be described below in detail.

The controller 130 may control the user terminal apparatus 100, the source apparatus 200 that interfaces with the user terminal apparatus 100, and the at least one speaker 50-1 to 50-4.

In particular, the controller 130 may acquire the reference magnetic field information generated by the at least one speaker 50-1 to 50-4 from the source apparatus 200 through the communicator 110.

Figure 3A:
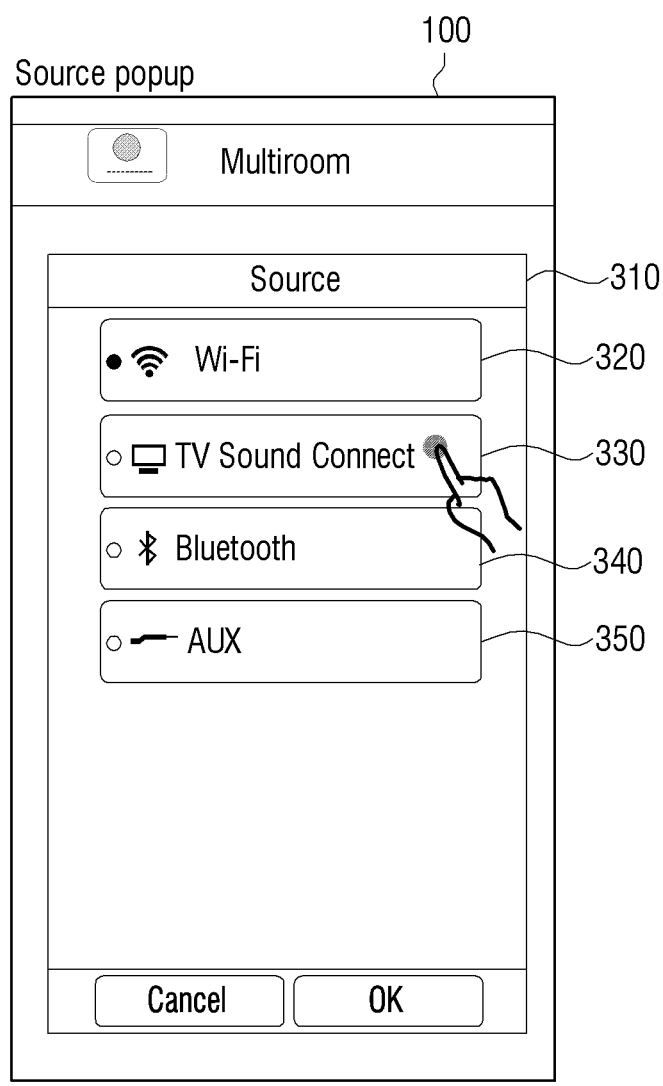
FIGS. 3A and 3B are diagrams for explanation of control of a source apparatus and each speaker using a user terminal apparatus according to an exemplary embodiment.
Figure 3B:
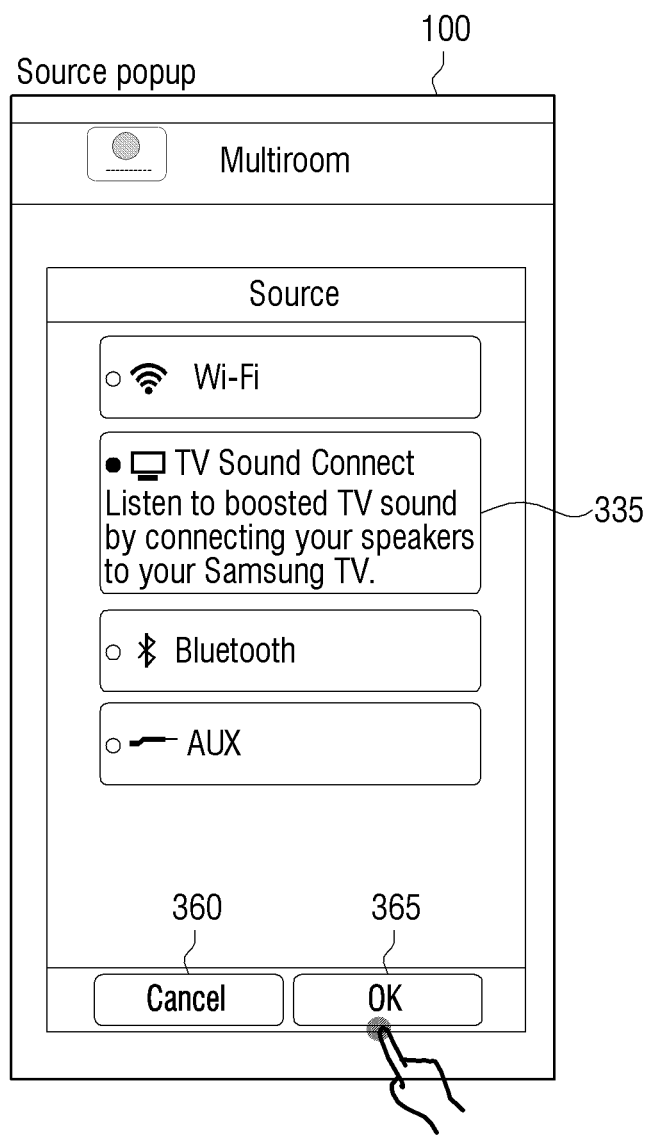

In detail, according to an embodiment, as illustrated in FIG. 3A, the controller 130 may command the display unit 140 to display a communication network connectable through the user terminal apparatus 100, e.g., Wi-Fi 320, TV sound connect 330, a communication network, such as Bluetooth 340, and a preliminary input/output terminal, such as AUX 350. In this case, the user may select an item of the TV sound connect 330 of source items 310. As shown in FIG. 3B, when a sound output function item 335 of a speaker connected to a TV is selected and then an OK 365 is lastly input, the user terminal apparatus 100 may control the source apparatus 200 to transmit reference magnetic field information of the speaker connected to the TV.

According to another embodiment, in response to the user terminal apparatus 100 being connected directly to the at least one speaker 50-1 to 50-4 through the communicator 110, the controller 130 may control the communicator 110 to receive reference magnetic field information generated by at least one speaker from the at least one speaker 50-1 to 50-4.

That is, the controller 130 according to an embodiment, may receive reference magnetic field information of the at least one speaker 50-1 to 50-4 from the source apparatus 200 or the at least one speaker 50-1 to 50-4.

According to some embodiments, the controller 130 may acquire location information of each of the at least one speaker 50-1 to 50-4 using the magnetic field information detected by the magnetic field detector 120 and the reference magnetic field information received through the communicator 110.

The controller 130 may control the magnetic field detector 120 to detect a direction of a magnetic field with a largest scale from each of the speakers 50-1 to 50-4. In this case, the direction of the magnetic field with a largest scale is detected and then a distance from the at least one speaker 50-1 to 50-4 may be extracted using intensity at a measurement direction according to a correlation between magnetic intensity and a distance (magnetic field intensity is inversely proportional to the square of a distance). Then the controller 130 may control the communicator 110 to acquire the location information (distance and direction information) of the at least one speaker 50-1 to 50-4 and to transmit the location information to the source apparatus 200.

Figure 4A:
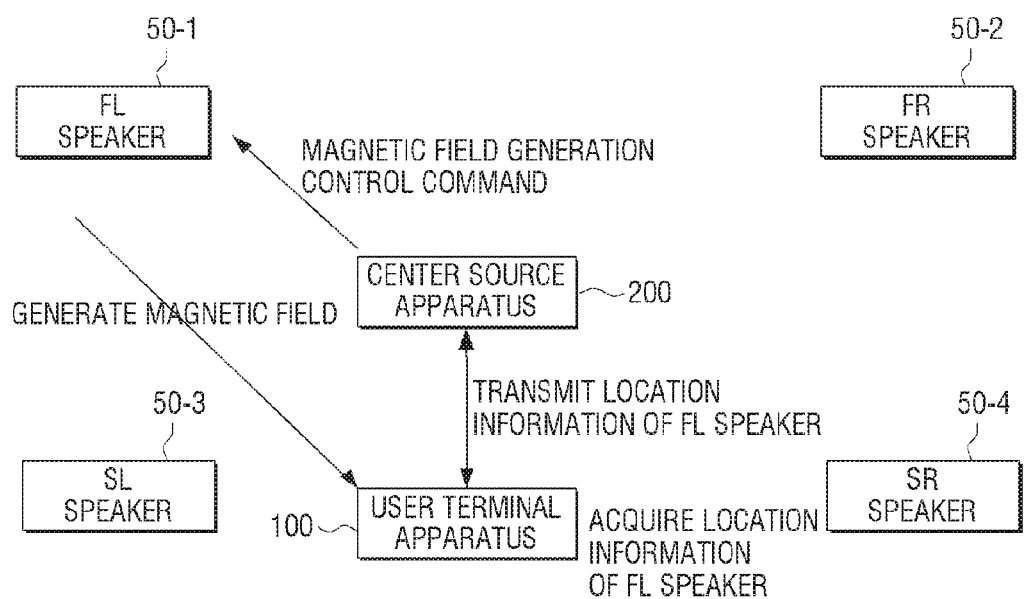
FIGS. 4A to 4E are diagrams for explanation of operations of a user terminal apparatus, a source apparatus, and a speaker.

In detail, as shown in an exemplary embodiment in FIG. 4A, the user terminal apparatus 100 may acquire the reference magnetic field information of the front left (FL) speaker 50-1 from the source apparatus 200. Then, in response to a magnetic field generation control command being transmitted to the FL speaker 50-1 by the source apparatus 200, the FL speaker 50-1 may generate a magnetic field. In this case, the controller 130 may control the magnetic field detector 120 to detect a direction of a magnetic field with a largest scale. In response to the direction of the magnetic field with a largest scale from the FL speaker 50-1 being determined to be detected, the controller 130 may detect the direction of the magnetic field of the FL speaker 50-1. For example, in response to a magnetic field with a largest scale being detected in a north-west direction through the magnetic field detector 120, the controller 130 may detect that the FL speaker 50-1 is positioned in the north-west direction.

In this case, the user terminal apparatus 100 may acquire the location information (direction and distance information) of the FL speaker 50-1 using the reference magnetic field information received from the source apparatus 200 and the magnetic field information of the FL speaker 50-1, detected by the magnetic field detector 120. For example, as shown in FIG. 4E, assuming that the received reference magnetic field information corresponds a magnetic field scale of 100 T to a distance of 0 m for the FL speaker 50-1, the controller 130 may determine a distance corresponding to north-west direction magnetic field scale 40 T as 2 m based on distance information corresponding to a reference magnetic field. That is, the controller 130 may acquire location information (direction: north-west; distance: 2 m) of the FL speaker 50-1 based on the reference magnetic field information.

Then the user terminal apparatus 100 may control the communicator 110 to transmit the location information (direction and distance information) of the FL speaker 50-1 to the source apparatus 200. The source apparatus 200 may map audio channels using the location information (direction; north-west; distance: 2 m) of the FL speaker 50-1, process an audio signal for control of an output level, and then transmit the audio signal to the FL speaker 50-1.

Figure 4B:
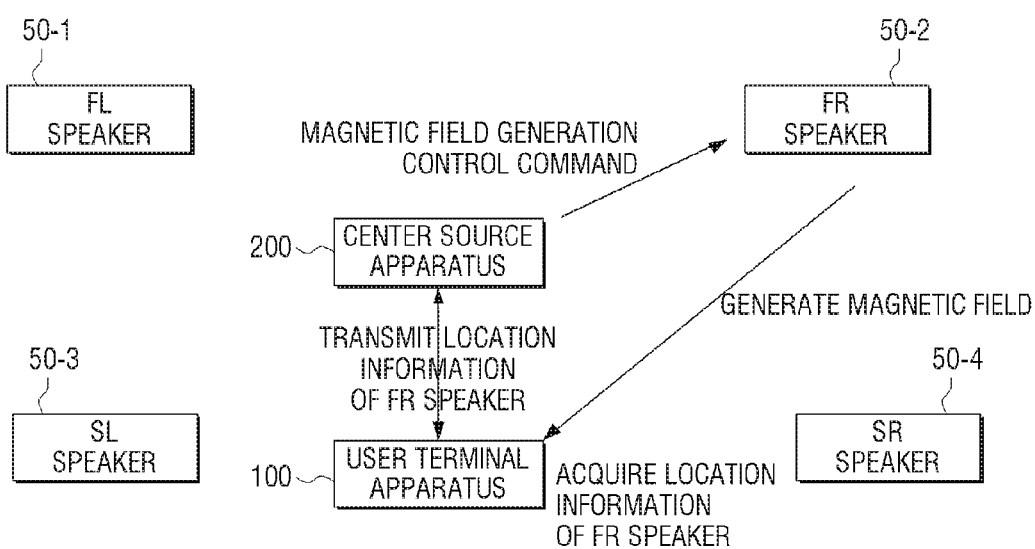

Continuously, as shown in FIG. 4B, the user terminal apparatus 100 may acquire the reference magnetic field information of the front right (FR) speaker 50-2 from the source apparatus 200. Then, in response to a magnetic field generation control command being transmitted to the FR speaker 50-2 by the source apparatus 200, the FR speaker 50-2 generates a magnetic field. In this case, the user terminal apparatus 100 may control the magnetic field detector 120 to detect a direction of a magnetic field with a largest scale. In response to a direction of a magnetic field with a largest scale from the FR speaker 50-2 being determined to be detected, the user terminal apparatus 100 may detect a direction of a magnetic field of the FR speaker 50-2. For example, in response to a magnetic field with a largest scale being detected as a north-east direction magnetic field by the controller 130 through the magnetic field detector 120, the controller 130 may detect that the FR speaker 50-2 is positioned in the north-east direction.

In this case, the user terminal apparatus 100 may acquire the location information (direction and distance information) of the FR speaker 50-2 of the reference magnetic field information and the detected magnetic field information of the FR speaker 50-2. For example, as shown in FIG. 4E, assuming that a distance corresponding to the received reference magnetic field information magnetic field scale 100 T of the FR speaker 50-2 is 0 m, the controller 130 may determine a distance corresponding to the north-east direction magnetic field scale 40 T based on the distance information corresponding to a magnetic field as 2 m. That is, the controller 130 may acquire the location information (direction: north-east; distance: 2 m) of the FR speaker 50-2 based on the reference magnetic field information.

Then the user terminal apparatus 100 may control the communicator 110 to transmit the location information of the FR speaker 50-2 to the source apparatus 200. The source apparatus 200 may map audio channels using the location information (direction: north-east; distance: 2 m) of the FR speaker 50-2, process an audio signal for control of an output level, and then transmit the audio signal to the FR speaker 50-2.

Figure 4C:
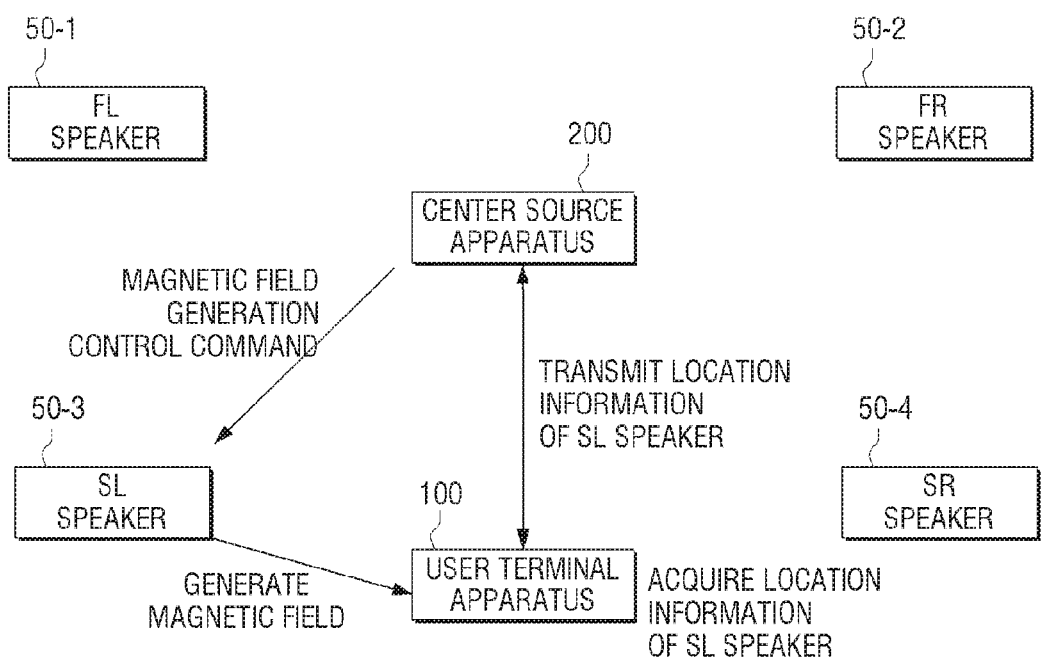

As shown in FIG. 4C, the user terminal apparatus 100 may acquire the reference magnetic field information of a surround left (SL) speaker 50-3 from the source apparatus 200. Then, in response to a magnetic field generation command being transmitted to the SL speaker 50-3 by the source apparatus 200, the SL speaker 50-3 generates a magnetic field. In this case, the controller 130 may control the magnetic field detector 120 to detect a direction of a magnetic field with a largest scale. In response to the direction of the magnetic field with a largest scale from the SL speaker 50-3 being determined, the controller 130 may detect a magnetic field direction of the SL speaker 50-3. For example, in response to a magnetic field with a largest scale being detected as a south-west direction magnetic field by the controller 130 through the magnetic field detector 120, the controller 130 may detect that the SL speaker 50-3 is positioned in the south-west direction.

In this case, the user terminal apparatus 100 may acquire the location information (direction and distance information) of the SL speaker 50-3 using the reference magnetic field information received from the source apparatus 200 and the magnetic field information of the SL speaker 50-3, detected by the magnetic field detector 120. For example, as shown in FIG. 4E, assuming that a distance corresponding to the received reference magnetic field information magnetic field scale 100 T of the SL speaker 50-3 is 0 m, the controller 130 may determine a distance corresponding to the south-west direction magnetic field scale 60 T based on a distance information corresponding to a magnetic field. That is, the controller 130 may acquire location information (direction: south-west; distance: 1 m) of the SL speaker 50-3 based on the reference magnetic field information.

Then the user terminal apparatus 100 may control the communicator 110 to transmit the location information (direction and distance information) of the SL speaker 50-3 to the source apparatus 200. The source apparatus 200 may map audio channels using the location information (direction; south-west; distance: 1 m) of the SL speaker 50-3, process an audio signal for control of an output level, and then transmit the audio signal to the SL speaker 50-3.

Figure 4D:
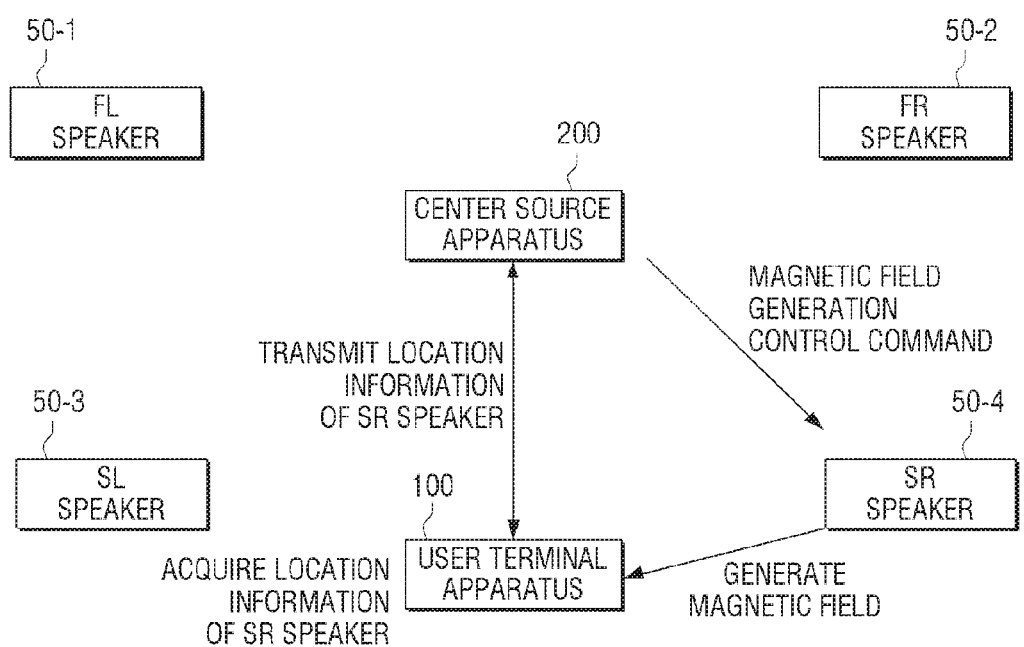
Figure 4E:
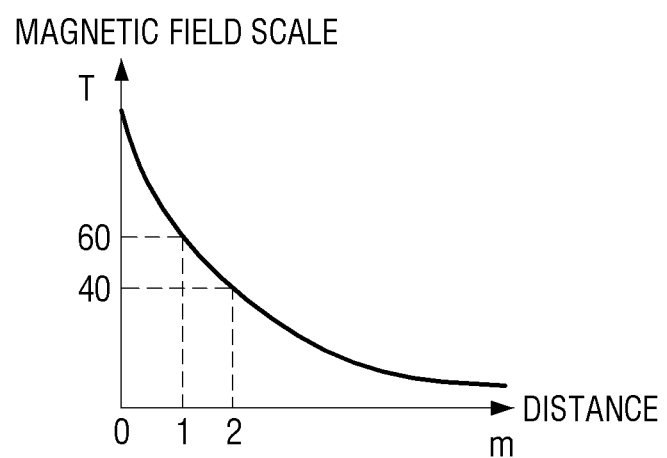

As shown in FIG. 4D, the user terminal apparatus 100 may acquire the reference magnetic field information of a surround right (SR) speaker 50-4 from the source apparatus 200. Then, in response to a magnetic field generation control command being transmitted to the SR speaker 50-4 by the source apparatus 200, the SR speaker 50-4 generates a magnetic field. In this case, the controller 130 may control the magnetic field detector 120 to detect a direction of a magnetic field with a largest scale. In response to a direction of a magnetic field with a largest scale from the SR speaker 50-4 being detected, the controller 130 may detect the SR speaker 50-4 positioned in a south-east direction.

For example, in response to a magnetic field with a largest scale being detected as the south-east direction magnetic field scale 60 T detected by the controller 130 through the magnetic field detector 120, the controller 130 may detect a direction (south-east) of the magnetic field of the SR speaker 50-4.

In this case, the user terminal apparatus 100 may acquire may acquire the location information (direction and distance information) of the SR speaker 50-4 using the reference magnetic field information received from the source apparatus 200 and the magnetic field information of the SR speaker 50-4, detected by the magnetic field detector 120. For example, as shown in FIG. 4E, assuming that a distance corresponding to the received reference magnetic field information magnetic field scale 100 T of the SR speaker 50-4 is 0 m, the controller 130 may determine a distance corresponding to the south-east direction magnetic field scale 60 T as 1 m. That is, the controller 130 may acquire the location information (direction: south-east; distance: 1 m) of the SR speaker 50-4 based on the reference magnetic field information.

Then the user terminal apparatus 100 may control the communicator 110 to transmit the location information (direction and distance information) of the SR speaker 50-4 to the source apparatus 200. The source apparatus 200 may map audio channels using the location information (direction; north-west; distance: 2 m) of the SR speaker 50-4, process an audio signal for control of an output level, and then transmit the audio signal to the SR speaker 50-4.

In the aforementioned embodiments, the example in which the reference magnetic field information is received from the source apparatus 200 has been described, but according to another embodiment, the user terminal apparatus 100 may control the communicator 110 to receive the reference magnetic field information according to an embodiment from the at least one speaker 50-1 to 50-4, not from the source apparatus 200.

Figure 5:
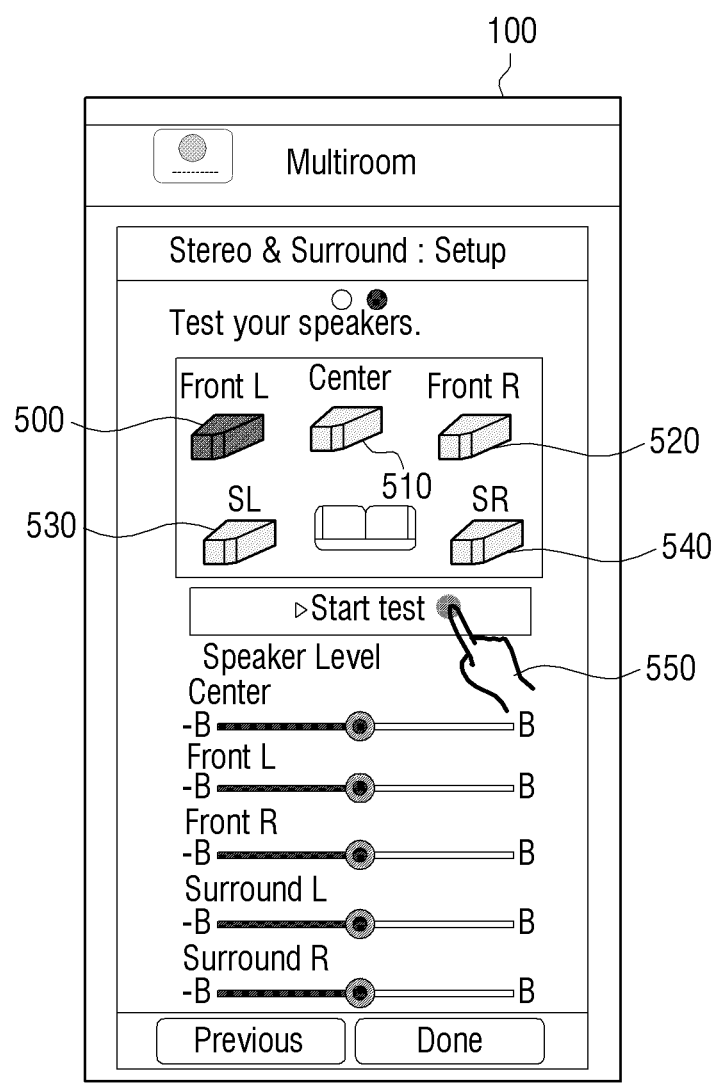
FIG. 5 is a diagram for explanation of an operation of controlling a distance and direction of a speaker using a user terminal apparatus.

FIG. 5 is a diagram for explanation of an operation of controlling a distance and direction of a speaker using the user terminal apparatus 100.

As described above, the source apparatus 200 may map audio channels of speakers based on location information of the at least one speaker 50-1 to 50-4, received from the user terminal apparatus 100 and control an output level. In this case, as shown in FIG. 5, the user terminal apparatus 100 may control the display unit 140 to display a UI for a volume control test of an FL speaker 500, a center speaker 510, an FR speaker 520, an SL speaker 530, and an SR speaker 540. In this case, in response to a start test 550 of the FL speaker 500 being input by a user, the source apparatus 200 may map audio channels of the FL speaker 500 and execute a test for output of an output level.

Hereinafter, the source apparatus 200 according to various embodiments will be described with reference to FIGS. 6 and 7.

Figure 6:
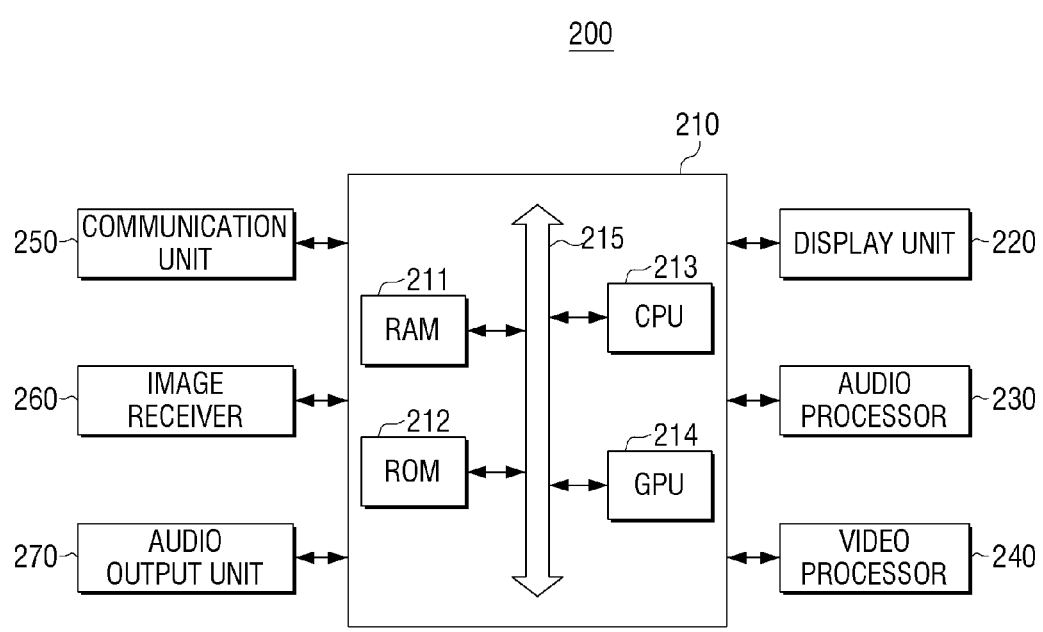
FIG. 6 is a block diagram illustrating a configuration of a source apparatus in detail according to an exemplary embodiment.
Figure 7:
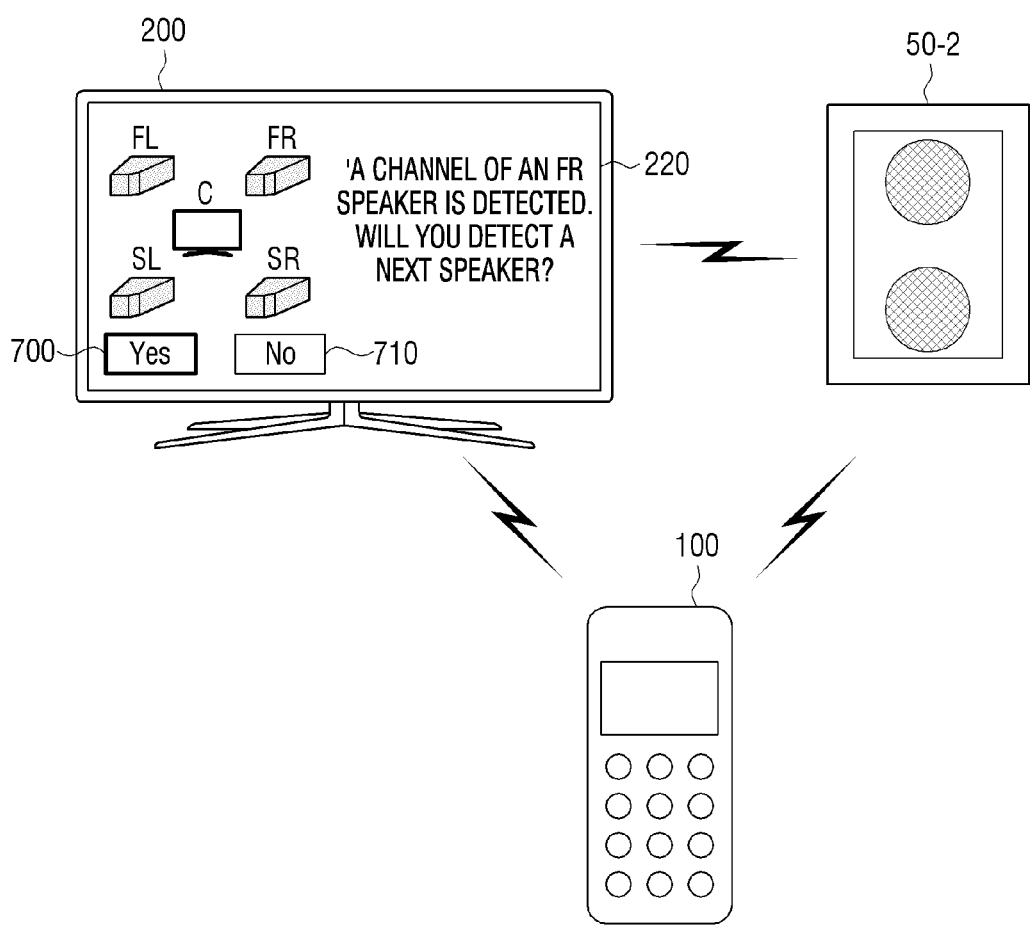
FIG. 7 is a diagram for explanation of an operation of displaying OSD about whether a speaker uses a channel and level controlling function, in a screen of a source apparatus, according to an exemplary embodiment.

FIG. 6 is a block diagram illustrating a configuration of the source apparatus 200 in detail according to an embodiment. As illustrated in FIG. 6, the source apparatus 200 includes a controller 210, a display unit 220, an audio processor 230, a video processor 240, a communicator 250, an image receiver 260, and an audio output unit 270.

FIG. 6 illustrates various components of the case in which, for example, the source apparatus 200 has various functions such as a communication function, a broadcasting receiving function, a video reproducing function, a display function, and so on. Accordingly, in some embodiments, some of the components illustrated in FIG. 6 may be omitted or changed and other components may be added.

As described above, the display unit 220 displays at least one of a video frame obtained by processing image data received from the image receiver 260 by the video processor 240 and various images generated by a graphic processor. The display unit 220 may display image content processed by the video processor 240 according to control of the controller 210.

In addition, the source apparatus 200 may control the display unit 220 to display a UI for setting the at least one speaker 50-1 to 50-4. In some embodiments, in response to a search command for finding the speakers 50-1 to 50-4 around the source apparatus 200 being input by a user, the source apparatus 200 searches the surrounding speakers 50-1 to 50-4 using a communication chip, such as a WiFi chip. In this case, in response to the at least one speaker 50-1 to 50-4 positioned around the communicator 250 being detected, the source apparatus 200 may control the display unit 220 to display a UI 'A channel of an FR speaker is detected. Will you detect a next speaker?', as shown in FIG. 7. In this case, in response to YES 700 being selected and input by a user, the source apparatus 200 may control the communicator 250 to transmit reference magnetic field information to the user terminal apparatus 100 and to sequentially transmit magnetic field generation request control commands to the retrieved at least one speaker 50-1 to 50-4, as described above.

The audio processor 230 is a component for processing audio data. The audio processor 230 may process various processes, such as decoding, amplification, noise filtering, and so on, on the audio data. The audio data processed by the audio processor 230 may be output to the audio output unit 270. According to an embodiment, as illustrated in FIG. 4A, the user terminal apparatus 100 may acquire the location information (direction: north-west; distance: 2 m) of the FL speaker 50-1 based on the reference magnetic field information and then transmit the location information to the source apparatus 200. In this case, the audio processor 230 may map audio channels using the location information (direction: north-west; distance: 2 m) of the FL speaker 50-1, transmitted from the user terminal apparatus 100 and process an audio signal for control of an output level. As shown in FIG. 4B, the user terminal apparatus 100 may acquire the location information (direction: north-east; distance: 2 m) of the FR speaker 50-2 based on the reference magnetic field information and then transmit the location information to the source apparatus 200. In this case, the audio output unit 270 may map audio channels using the location information (direction: north-east; distance: 2 m) of the FR speaker 50-2, transmitted from the user terminal apparatus 100 and process an audio signal for control of an output level. As shown in FIG. 4C, the user terminal apparatus 100 may acquire the location information (direction: south-west; distance: 1 m) of the SL speaker 50-3 based on the reference magnetic field information and then transmit the location information to the source apparatus 200. In this case, the audio output unit 270 may map audio channels using the location information (direction: south-west; distance: 1 m) of the SL speaker 50-3, transmitted from the user terminal apparatus 100, and process an audio signal for control of an output level. As shown in FIG. 4D, the user terminal apparatus 100 may acquire the location information (direction: south-east; distance: 1 m) of the SR speaker 50-4 based on the reference magnetic field information and then transmit the location information to the source apparatus 200. In this case, the audio output unit 270 may map audio channels using the location information (direction: south-east; distance: 1 m) of the SR speaker 50-4, transmitted from the user terminal apparatus 100, and process an audio signal for control of an output level.

The video processor 240 process image content received from the image receiver 260 in the form of displayable data. The video processor 240 may perform various image processing processes such as decoding, scaling, noise filtering, frame rate conversion, resolution conversion, etc. on the image data.

The communicator 250 is a component that communicates with various types of external devices or external servers according to various types of communication methods. The communicator 250 may include various communication chips such as a WiFi chip, a Bluetooth chip, an NFC chip, and a wireless communication chip, among others. In this case, the WiFi chip, the Bluetooth chip, and the NFC chip may perform communication using a WiFi method, a Bluetooth method, and an NFC method, respectively. In embodiments of the NFC chip, the NFC chip refers to a chip that operates using a near field communication (NFC) using a band of 13.56 MHz of various RF-ID frequency bands such as 135 kHz, 13.56 MHz, 433 MHz, 860~960 MHz, 2.45 GHz, and so on. When the WiFi chip or the Bluetooth chip is used, the communicator 250 may first transmit and receive various connection information items such as SSID and key session to form communication using the connection information items, and then may transmit and receive various information items. The wireless communication ship refers to a chip that performs communication according to various communication standards such as IEEE, ZigBee, $3^{rd}$ generation (3G), $3^{rd}$ generation partnership project (3GPP), long term evolution (LTE), and so on.

As described above, according to an embodiment, in response to a search command for finding the speakers 50-1 to 50-4 around the source apparatus 200 being input by a user, the source apparatus 200 searches the surrounding speakers 50-1 to 50-4 using the WiFi chip of the communicator 250, and then the source apparatus 200 may control the display unit 220 to display a UI 'A channel of an FL speaker is detected. Will you detect a next speaker?', as shown in FIG. 7.

The image receiver 260 receives content through various external sources. In detail, the image receiver 260 may receive broadcasting content from an external broadcaster, receive image content from an external device, and receive streaming content from an external server.

The audio output unit 270 outputs audio data of image content. The audio output unit 270 is a component that outputs various alarms or a voice message as well as various audio data items processed by the audio processor 230. According to an embodiment, when a center speaker is installed in the source apparatus 200, the audio processor 230 may map audio channels and process an audio signal for control of an output level, and then the audio output unit 270 may output audio.

The controller 210 controls an overall operation of the source apparatus 200.

As shown in FIG. 6, the controller 210 includes a RAM 211, a ROM 212, a CPU 213, a GPU 214, and a bus 215. In this case, the RAM 211, the ROM 212, the CPU 213, and the GPU 214 may be connected through the bus 215.

The ROM 212 stores a command set command, etc. for system booting. In response a turn-on command of the source apparatus 200 being input to supply power, the CPU 213 copies an O/S stored in the storage unit according to the command stored in the storage unit according to the command stored in the ROM 212 to the RAM 211 and execute the O/S to boot system.

The GPU 214 generates an image including various objects such as an icon, an image, a text, content, and so on using a calculator (not shown) and a rendering unit (not shown).

The CPU 213 accesses a storage unit (not shown) to perform booting using an O/S stored in the storage unit. In addition, the CPU 213 may perform various operations using various programs, content, data, and so on, stored in the storage unit.

In particular, in response to a search command of the at least one speaker 50-1 to 50-4 being input from a user, when a user inputs a search command for finding the speakers 50-1 to 50-4 around the source apparatus 200, the controller 210 may search the surrounding speakers 50-1 to 50-4 using the WiFi chip of the communicator 250 and then may display the display unit 220 to display a UI 'A channel of an FL speaker is detected. Will you detect a next speaker?', as illustrated in FIG. 7, according to an embodiment. Then, in response to YES 700 being selected and input by the user, as described above, the controller 210 may control the communicator 250 to transmit reference magnetic field information to the user terminal apparatus 100 and then may control the communicator 250 to sequentially transmit a magnetic field generation request control command to the retrieved at least one speaker 50-1 to 50-4.

Figure 8:
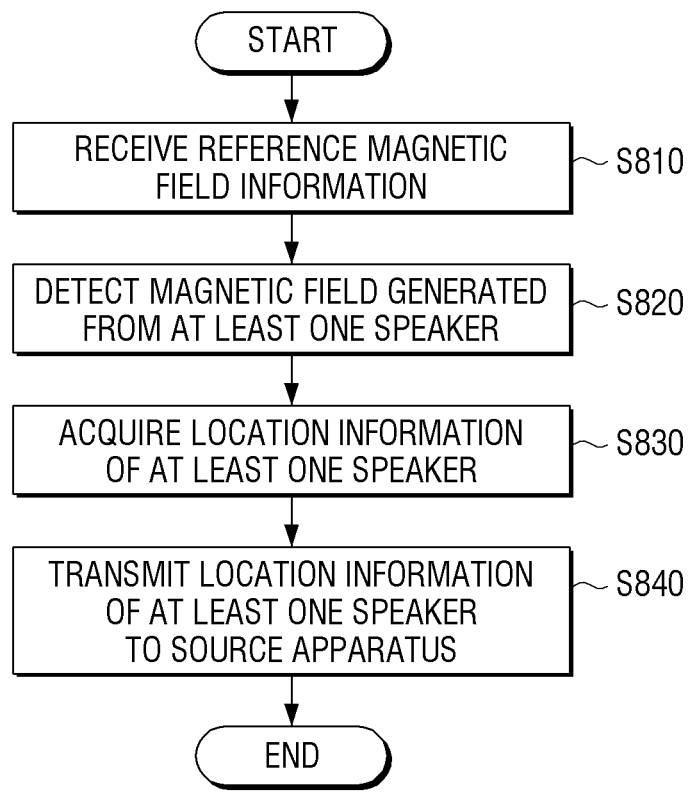
FIG. 8 is a flowchart for explanation of an operation for controlling a location and level of a speaker using a user terminal apparatus.

FIG. 8 is a flowchart for explanation of an operation for controlling a location and level of a speaker using the user terminal apparatus 100.

Referring to FIG. 8, the user terminal apparatus 100 receives reference magnetic field information (S810). As described above, the reference magnetic field information may be received from the source apparatus 200, or according to an embodiment, the reference magnetic field information may be received from the at least one speaker 50-1 to 50-4.

After receiving the reference magnetic field information, when the source apparatus 200 transmits a magnetic field generation control command to the at least one speaker 50-1 to 50-4, the user terminal apparatus 100 detects a magnetic field generated from the at least one speaker 50-1 to 50-4 (S820). As described above, the user terminal apparatus 100 detects a direction of a magnetic field with a largest scale using the magnetic field detector 120, including a three-axis magnetic field detection sensor, to acquire direction information of a speaker.

Then, the user terminal apparatus 100 acquires at least one speaker location information item (S830). In detail, the user terminal apparatus 100 detects a direction of a magnetic field with a largest scale using the magnetic field detector 120, including a three-axis magnetic field detection sensor, to acquire direction information of a speaker and then acquire distance information of the speaker using the detected magnetic field information and the reference magnetic field information according to a correlation in which magnetic field intensity is in inverse proportion to square of a distance.

The user terminal apparatus 100 transmits at least one location information item (direction information and distance information) to a source apparatus (S840). As described above, in response to the location information of each of the at least one speaker 50-1 to 50-4 being received from the user terminal apparatus 100, the source apparatus 200 may map audio channels of at least one speaker based on the location information of each of the at least one speaker 50-1 to 50-4 and control output levels.

FIG. 9 is a sequence diagram for explanation of a control operation of an audio system according to an embodiment. Referring to FIG. 9, when the user terminal apparatus 100 is connected to the source apparatus 200 for controlling at least one speaker 300, the source apparatus 200 may transmit reference magnetic field information of the at least one speaker 300 to the user terminal apparatus 100 (S910). In addition, the source apparatus 200 transmits a control command for generation of a magnetic field based on the reference magnetic field information of the at least one speaker to the at least one speaker (S920).

Then the at least one speaker 300 may generate a magnetic field (S930). The user terminal apparatus 100 detects a magnetic field generated by the at least one speaker 300 (S940).

The user terminal apparatus 100 acquires location information of the at least one speaker 300 using the detected magnetic field information and the reference magnetic field information (S950).

In addition, in response to the location information of at least one speaker being transmitted to the source apparatus 200 by the user terminal apparatus 100 (S920), the source apparatus 200 processes audio data based on the location information of the at least one speaker 300 (S970). In this case, after the source apparatus 200 transmits the audio data to the at least one speaker 300 (S980), the source apparatus 200 maps audio channels and controls output levels (S990)

A program code for executing the control method of a user terminal apparatus according to the aforementioned various embodiments may be stored in a non-transitory computer readable medium. The non-transitory computer readable media may refer to a medium that semi-permanently stores data and is readable by a device instead of a medium that stores data for a short time period, such as a register, a cache, a memory, etc. In detail, the aforementioned programs may be stored and provided in the non-transitory computer readable media such as CD, DVD, hard disc, blue ray disc, USB, a memory card, ROM, etc.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures above, it will be understood by those of ordinary skill in the art that various changes in form and details may be made therein without departing from the spirit and scope as defined by the following claims.

What is claimed is:

1. A method of controlling a user terminal apparatus, the method comprising:
    receiving first reference magnetic field information corresponding to a first speaker;
    detecting a first magnetic field generated by the first speaker in response to a command from a source apparatus;
    determining first location information of the first speaker using the detected first magnetic field and the received first reference magnetic field information; and
    transmitting the determined first location information of the first speaker to the source apparatus which controls the first speaker such that the source apparatus controls an output level of the first speaker based on the first location information.

2. The method of claim 1, wherein the determining the first location information comprises detecting a direction of the first magnetic field with a largest scale, to determine direction information of the first speaker using a three-axis magnetic field detection sensor, and finding distance information of the first speaker, using the first magnetic field and the first reference magnetic field information.

3. The method of claim 1, wherein the receiving comprises receiving the first reference magnetic field information from the source apparatus, in response to the user terminal apparatus being connected to the source apparatus.

4. The method of claim 1, wherein the first reference magnetic field information is generated by the first speaker in response to the user terminal apparatus being connected directly to the first speaker.

5. The method of claim 1, wherein the source apparatus maps a first audio channel to the first speaker based on the first location information of and controls the output level of the first speaker based on the first location information received from the user terminal apparatus.

6. The method of claim 1, wherein:
    the source apparatus displays a user interface (UI) for setting location information of a speaker, and
    in response to the first location information of the first speaker being received from the user terminal apparatus, the source apparatus displays a message indicating the first location information is acquired, in the UI.

7. The method of claim 1, wherein the first reference magnetic field information comprises a first correlation between a magnetic field scale and a distance from the first speaker.

8. The method of claim 1, wherein the first reference magnetic field information comprises a first mathematical function correlating a magnetic field scale and a distance from the first speaker.

9. The method of claim 1, wherein the reference magnetic field information is sent to a device from the first speaker.

10. The method of claim 1, wherein the reference magnetic field information is sent to a device from the source apparatus.

11. A user terminal apparatus comprising:
    a communicator configured to communicate with a source apparatus;
    a magnetic field detector configured to detect a first magnetic field generated by a first speaker in response to a command from the source apparatus; and
    a processor configured to acquire first reference magnetic field information corresponding to the first speaker through the communicator, determine first location information of the first speaker using the first magnetic field detected through the magnetic field detector and the first reference magnetic field information, and control the communicator to transmit the determined first location information of the first speaker to the source apparatus such that the source apparatus controls an output level of the first speaker based on the first location information.

12. The user terminal apparatus of claim 11, wherein the magnetic field detector comprises a three-axis magnetic field detection sensor, and
    wherein the processor is further configured to detect a direction of the first magnetic field with a largest scale to determine direction information of the first speaker using the three-axis magnetic field detection sensor and acquire distance information of the first speaker using the first magnetic field and the first reference magnetic field information.

13. The user terminal apparatus of claim 11, wherein the processor is further configured to control the communicator to receive the first reference magnetic field information generated by the first speaker in response to the user terminal apparatus being connected directly to the first speaker through the communicator.

14. The user terminal apparatus of claim 11, wherein the source apparatus is configured to map a first audio channel to the first speaker based on the first location information and control a first output level of the first speaker based on the first location information received from the user terminal apparatus.

15. The user terminal apparatus of claim 11, wherein the source apparatus is configured to:
    display a user interface (UI) for setting location information of a speaker, and
    display a message indicating that the first location information is acquired, in the UI, in response to receiving the first location information.

16. The user terminal apparatus of claim 11, wherein the magnetic field detector is further configured to detect a second magnetic field generated by a second speaker, and
    the processor is further configured to acquire second reference magnetic field information corresponding to the second speaker through the communicator and determine second location information of the second speaker using the second magnetic field detected through the magnetic field detector and the second reference magnetic field information.

17. An audio system for use with a user terminal apparatus, the audio system comprising:

a first speaker; and a source apparatus configured to transmit first reference magnetic field information corresponding to the first speaker to the user terminal apparatus, in response to the user terminal apparatus being connected to the source apparatus, wherein the source apparatus is further configured to transmit a first control command to the first speaker, wherein the first speaker is configured to generate a first magnetic field corresponding to the first reference magnetic field information in response to the first control command, and wherein the user terminal apparatus is configured to detect the first magnetic field in response to a command from the source apparatus, determine first location information of the first speaker using the first magnetic field and the first reference magnetic field information, transmit the first location information to the source apparatus, process first audio data based on the first location information and transmit the first audio data to the first speaker such that the source apparatus controls an output level of the first speaker based on the first location information.

18. The audio system of claim 17, wherein the source apparatus is further configured to map a first audio channel to the first speaker based on the first location information and control a first output level of the first speaker based on the first location information.

19. The audio system of claim 17, wherein the source apparatus is further configured to:
  display a user interface (UI) for setting location information of a speaker, and
  display a message indicating the first location information is acquired, in the UI, in response to receiving the first location information.

20. The audio system of claim 17, further comprising a second speaker, wherein the source apparatus is further configured to transmit second reference magnetic field information corresponding to the second speaker to the user terminal apparatus, wherein the source apparatus is further configured to transmit a second control command to the second speaker, wherein the second speaker is configured to generate a second magnetic field corresponding to the second reference magnetic field information in response to the second control command, and wherein the user terminal apparatus is further configured to detect the second magnetic field, determine second location information of the second speaker using the second magnetic field information and second first reference magnetic field information, transmit the second location information to the source apparatus, process second audio data based on the second location information and transmit the second audio data to the second speaker.

21. A method of locating a speaker in an audio system, the method comprising:
  receiving reference magnetic field information of the speaker;
  detecting a magnetic field generated by the speaker in response to a command from a source apparatus;
  acquiring location information of the speaker by using information of the detected magnetic field and the reference magnetic field information; and
  transmitting the acquired location information of the speaker to the source apparatus which controls the speaker such that the source apparatus controls an output level of the speaker based on the location information.

22. The method of claim 21, wherein the location information comprises a direction of the generated magnetic field and a distance from the speaker.

* * * * *